United States Patent
Liu et al.

(10) Patent No.: US 9,148,144 B1
(45) Date of Patent: Sep. 29, 2015

(54) MONOLITHIC TRANSMIT/RECEIVE MODULE DRIVER INCLUDING PIN DRIVER

(71) Applicant: M/A-COM Technology Solutions Holdings, Inc., Lowell, MA (US)

(72) Inventors: Chengxin Liu, Bedford, MA (US); Christopher D. Weigand, Andover, MA (US)

(73) Assignee: M/A-COM Technology Solutions Holdings, Inc., Lowell, MA (US)

(*) Notice: Subject to any disclaimer, the term of this patent is extended or adjusted under 35 U.S.C. 154(b) by 3 days.

(21) Appl. No.: 14/167,079

(22) Filed: Jan. 29, 2014

Related U.S. Application Data

(63) Continuation-in-part of application No. 13/592,816, filed on Aug. 23, 2012, now Pat. No. 8,933,727.

(51) Int. Cl.
*H03K 19/00* (2006.01)
*H03K 19/0175* (2006.01)

(52) U.S. Cl.
CPC ........ *H03K 19/0008* (2013.01); *H03K 19/0175* (2013.01)

(58) Field of Classification Search
CPC .................................................. H04L 25/0272
See application file for complete search history.

(56) References Cited

U.S. PATENT DOCUMENTS

| | | | |
|---|---|---|---|
| 5,995,062 A | 11/1999 | Denney et al. | 343/853 |
| 6,510,487 B1 * | 1/2003 | Raza et al. | 711/100 |
| 7,321,651 B2 * | 1/2008 | Boerstler et al. | 377/30 |
| 7,728,771 B2 | 6/2010 | Lee et al. | 342/368 |

* cited by examiner

*Primary Examiner* — Jany Richardson
(74) *Attorney, Agent, or Firm* — Christopher P. Maiorana, PC

(57) ABSTRACT

An integrated circuit includes a first circuit and a second circuit. The first circuit may be configured to generate a plurality of complementary outputs based upon a plurality of inputs, a first control signal, and a second control signal, where the plurality of inputs is received as a serial data stream. The second circuit may be configured to generate one or more pairs of complementary output signals and a plurality of open-drain outputs in response to a third control signal, a fourth control signal, a fifth control signal, and a sixth control signal. A first complementary output of each pair of complementary output signals has a higher current capability than a second complementary output of each pair of complementary output signals.

20 Claims, 11 Drawing Sheets

TABLE 1

| INPUTS | | | | OUTPUTS | | | | | | | | | |
|---|---|---|---|---|---|---|---|---|---|---|---|---|---|
| SWEN1 | SWEN2 | EN | T/R | SW1A50 | SW1B50 | SW2A50 | SW2B50 | SW3A1 | SW3B1 | SW4A1 | SW4B1 | L1, L2 | P1, P2 |
| 0 | 0 | 0 | 0 | VSS | VOPT1 | VSS | VOPT2 | VEE | GND | VEE | GND | VEE | VEE |
| 0 | 0 | 0 | 1 | VOPT1 | VSS | VOPT2 | VSS | VEE | GND | VEE | GND | VEE | VEE |
| 0 | 0 | 1 | 0 | VSS | VOPT1 | VSS | VOPT2 | VEE | GND | VEE | GND | GND | VEE |
| 0 | 0 | 1 | 1 | VOPT1 | VSS | VOPT2 | VSS | VEE | GND | VEE | GND | VEE | GND |
| 0 | 1 | 0 | 0 | VSS | VOPT1 | VSS | VOPT2 | VEE | GND | VEE | VEE | VEE | VEE |
| 0 | 1 | 0 | 1 | VOPT1 | VSS | VOPT2 | VSS | VEE | GND | VEE | VEE | VEE | VEE |
| 0 | 1 | 1 | 0 | VSS | VOPT1 | VSS | VOPT2 | VEE | GND | VEE | VEE | GND | VEE |
| 0 | 1 | 1 | 1 | VOPT1 | VSS | VOPT2 | VSS | VEE | GND | VEE | VEE | VEE | GND |
| 1 | 0 | 0 | 0 | VSS | VOPT1 | VSS | VOPT2 | GND | VEE | VEE | GND | VEE | VEE |
| 1 | 0 | 0 | 1 | VSS | VOPT1 | VOPT2 | VSS | VEE | VEE | VEE | GND | VEE | VEE |
| 1 | 0 | 1 | 0 | VSS | VOPT1 | VSS | VOPT2 | GND | VEE | VEE | GND | GND | VEE |
| 1 | 0 | 1 | 1 | VSS | VOPT1 | VOPT2 | VSS | VEE | VEE | VEE | GND | VEE | GND |
| 1 | 1 | 0 | 0 | VSS | VOPT1 | VSS | VOPT2 | GND | VEE | GND | VEE | VEE | VEE |
| 1 | 1 | 0 | 1 | VSS | VOPT1 | VSS | VOPT2 | VEE | VEE | GND | VEE | VEE | VEE |
| 1 | 1 | 1 | 0 | VSS | VOPT1 | VSS | VOPT2 | GND | VEE | GND | VEE | GND | VEE |
| 1 | 1 | 1 | 1 | VSS | VOPT1 | VSS | VOPT2 | VEE | VEE | VEE | VEE | VEE | GND |

FIG. 6

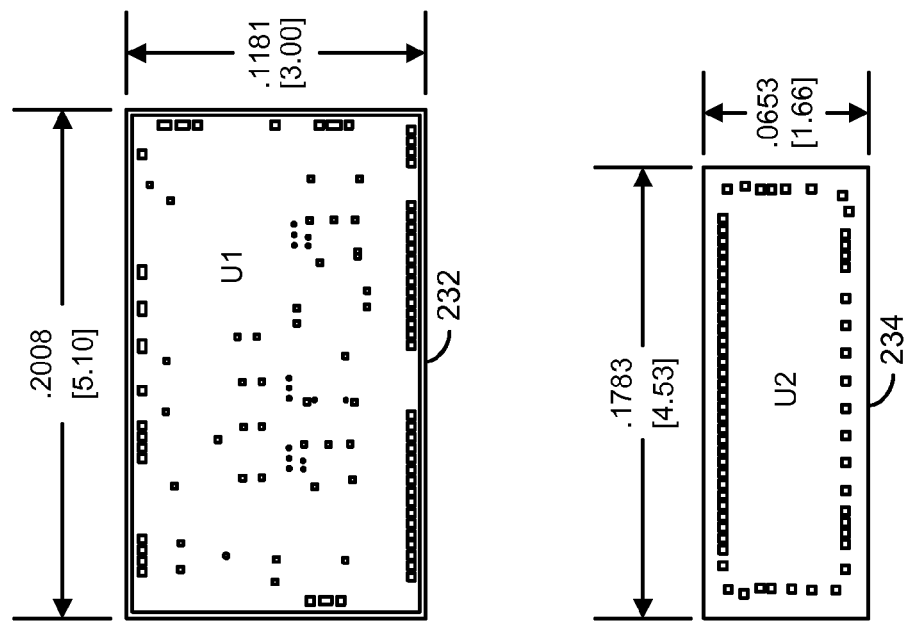
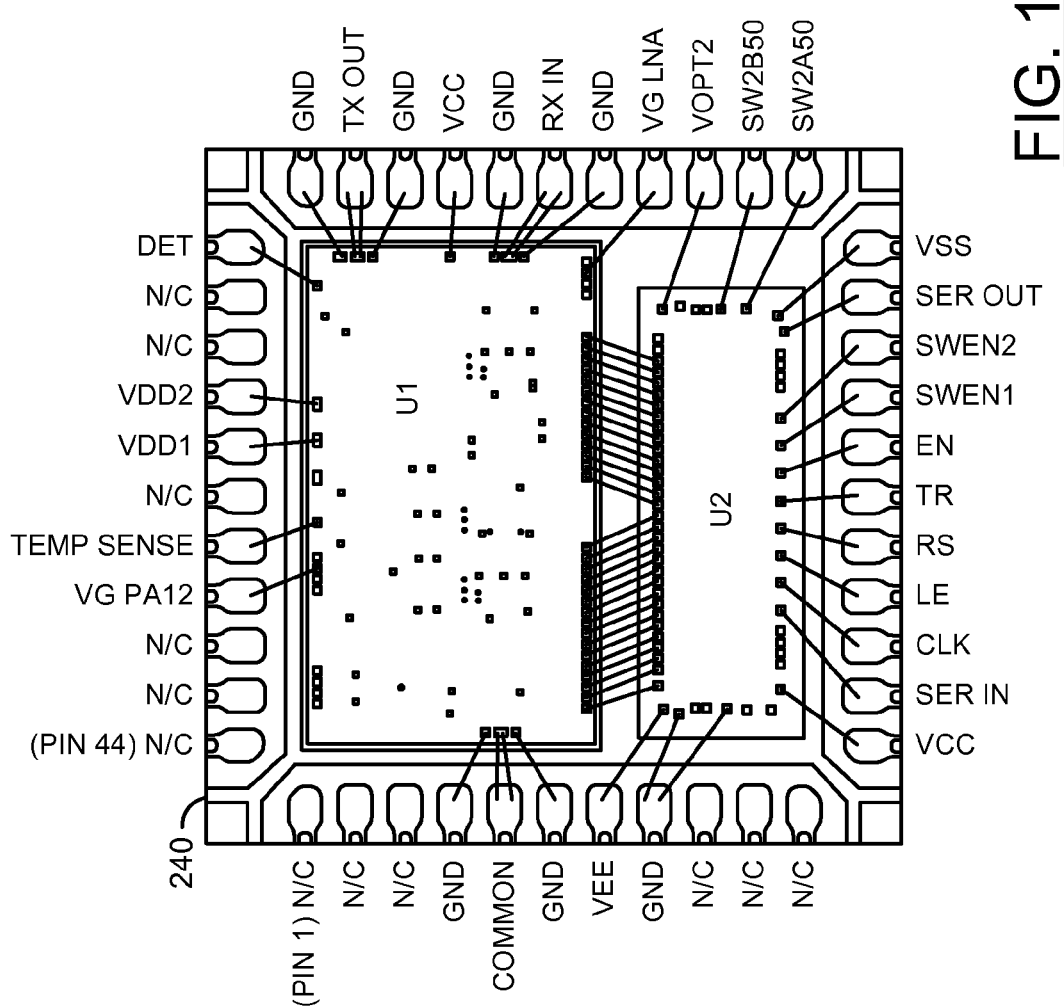
FIG. 10

MONOLITHIC TRANSMIT/RECEIVE MODULE DRIVER INCLUDING PIN DRIVER

This application relates to U.S. Ser. No. 13/592,816 filed Aug. 23, 2012, now U.S. Pat. No. 8,933,727, which is incorporated by reference in its entirety.

FIELD OF THE INVENTION

The present invention relates to radar systems generally and, more particularly, to a method and/or apparatus for implementing a monolithic transmit/receive (T/R) module driver that includes a PIN driver.

BACKGROUND OF THE INVENTION

Transmit/receive (T/R) modules are often used in radar arrays. Typical T/R modules can include power amplifier (PA) stages, low noise amplifier (LNA) stages, digital phase shifters, digital attenuators and T/R switches for interconnecting various components depending on whether the T/R module is in a transmit or a receive mode. Driving conventional T/R modules takes multiple drivers and discrete components.

It would be desirable to implement a monolithic T/R module driver that can drive the numerous switches, phase shifters and attenuators, enable and disable receive and transmit amplifiers to reduce power dissipation, and also drive PIN diodes in high power input/output switches.

SUMMARY OF THE INVENTION

The present invention concerns an integrated circuit comprising a first circuit and a second circuit. The first circuit may be configured to generate a plurality of complementary outputs based upon a plurality of inputs, a first control signal, and a second control signal, where the plurality of inputs is received as a serial data stream. The second circuit may be configured to generate one or more pairs of complementary output signals and a plurality of open-drain outputs in response to a third control signal, a fourth control signal, a fifth control signal, and a sixth control signal. A first complementary output of each pair of complementary output signals has a higher current capability than a second complementary output of each pair of complementary output signals.

The objects, features and advantages of the present invention include providing a monolithic transmit/receive (T/R) module driver including a PIN driver that may (i) reduce the number of drive signals, (ii) reduce the number of package pins needed, (iii) provide separate control of multiple amplifier stages to reduce potential feedback, (iv) handle enough current to drive PIN diode switches, (v) provide an idle state when switching between transmit and receive modes avoiding potential loop oscillation, (vi) control transmitter and receiver amplifiers based on operating mode, and/or (vii) be implemented as an integrated circuit or multi-chip module.

BRIEF DESCRIPTION OF THE DRAWINGS

These and other objects, features and advantages of the present invention will be apparent from the following detailed description and the appended claims and drawings in which:

FIG. 6 is a truth table illustrating example operation of a transmit/receive module driver in accordance with an embodiment of the present invention;

FIG. 10 is a diagram illustrating a multi-chip module package in which an integrated circuit implementing a T/R module driver in accordance with an embodiment of the present invention and an integrated circuit implementing T/R module may be mounted;

DETAILED DESCRIPTION OF THE PREFERRED EMBODIMENTS

Figure 1:
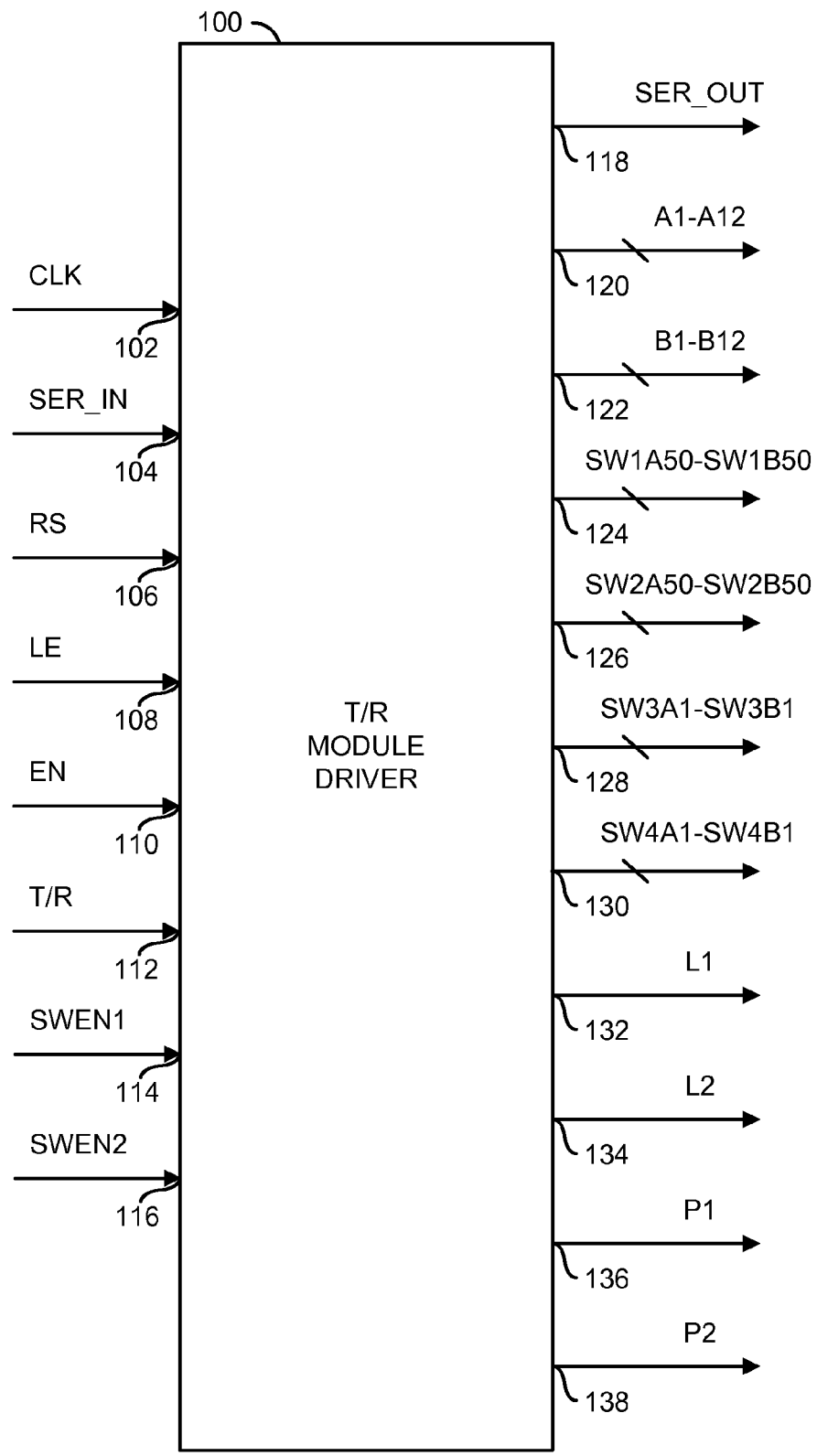
FIG. 1 is a diagram illustrating a transmit/receive module driver in accordance with an embodiment of the present invention.

Referring to FIG. 1, a diagram is shown illustrating a circuit 100 in accordance with an embodiment of the present invention. In one example, the circuit 100 may implement a transmit/receive module driver. The circuit 100 may, in one example, be implemented as a dedicated complimentary metal oxide semiconductor (CMOS) driver for use with multifunction modules such as GaAs based transmit/receive (T/R) modules and high current PIN diode switches. The circuit 100 may be implemented on a monolithic integrated circuit (IC). In one example, the circuit 100 may be configured to accept transmit/receive and enable inputs, and translate the transmit/receive and enable inputs to (i) control transmit/receive (T/R) switches in a transmit/receive (T/R) module, (ii) control PIN diode switches attached to a T/R module, and (iii) enable/disable transmit and receive amplifiers either separately or shutting off both transmit and receive amplifiers to provide an idle state and/or a power conservation state. In various embodiments, the amplifier control draws no current when the amplifiers are disabled.

The circuit 100 may include a serial interface. In one example, a 24-bit serial interface may be implemented. However, other numbers of bits may be implemented accordingly to meet the design criteria of a particular implementation. In various embodiments, the serial interface may be configured to drive digital attenuators and/or phase shifters. The circuit 100 may also include functionality to switch between transmit and receive channels and to enable/disable low-noise amplifiers (LNAs) and/or power amplifiers (PAs). In one example, high speed analog CMOS technology may be utilized in implementing the transmit/receive module driver 100 to achieve low power consumption at moderate to high speeds.

In one example, the T/R module driver 100 may include an input 102, an input 104, an input 106, an input 108, an input 110, an input 112, an input 114, an input 116, an output 118, an output 120, an output 122, an output 124, an output 126, an output 128, an output 130, an output 132, an output 134, an output 136, an output 138. The input 102 may receive a clock signal (e.g., CLK). The input 104 may receive a serial data stream (e.g., SER_IN). The input 106 may receive a signal (e.g., R/S). The input 108 may receive a signal (e.g., LE). The input 110 may receive a signal (e.g., EN). The input 112 may receive a signal (e.g., T/R). The input 114 may receive a signal (e.g., SWEN1). The input 116 may receive a signal (e.g., SWEN2). The output 118 may present a serial output data stream (e.g., SER_OUT). The output 120 may present a first set of parallel outputs (e.g., A1-A12). The output 122 may present a second set of parallel outputs (e.g., B1-B12). In one example, the outputs B1-B12 may be complementary to the outputs A1-A12. The output 124 may present a pair of complementary signals (e.g., SW1A50 and SW1B50). The output 126 may present a pair of complementary signals (e.g., SW2A50 and SW2B50). The output 128 may present a pair of complementary signals (e.g., SW3A1 and SW3B1). The output 130 may present a pair of complementary signals (e.g., SW4A1 and SW4B1). The outputs 124 and 126 may provide high-current (e.g., 50 mA) outputs. The outputs 128 and 130 may provide low-current (e.g., 1 mA) outputs. The output 132 may present a signal (e.g., L1). The output 134 may present a signal (e.g., L2). The output 136 may present a signal (e.g., P1). The output 138 may present a signal (e.g., P2).

The signal LE may implement a control signal that may be used to latch input data received via the signal SER_IN. The signal RS may implement a control signal that may be used to select between multiple control values supplied via the serial data stream SER_IN. In an example where the signal SER_IN supplies 24-bit serial data containing two 12-bit control values (e.g., C1A-C12A and C1B-C12B), the signal LE may be used to latch the 24-bit data (e.g., into two registers) and the signal RS may be used to select between the two 12-bit control values C1A-C12A and C1B-C12B (e.g., by enabling/disabling register outputs, multiplexing register outputs, etc.). Having multiple sets of control values in the serial data stream SER_IN allows parameters (e.g., attenuation, phase states, etc.) in circuitry attached to the circuit 100 to be quickly changed (e.g., by changing a value (or state) of the signal RS).

The signal EN may implement a control signal that may be used to enable/disable circuitry attached to the circuit 100. In one example, the signal EN may be implemented as a single bit that enables/disables two separate circuits in a complementary configuration. In another example, the signal EN may be implemented as a multi-bit control signal configured to separately enable/disable individual circuits. The signals SWEN1 and SWEN2 may implement control signals that may be used to select between high-current (e.g., 50 mA) and low-current (e.g., 1 mA) outputs for controlling circuitry attached to the circuit 100. The signal T/R may be implemented as a control signal for switching between a transmit and a receive mode. In one example, the signals EN and T/R may be used to control logic configured to enable/disable low noise amplifiers (LNAs) and power amplifiers (PAs) attached to the circuit 100. In one example, the signals SWEN1, SWEN2, and T/R may be used to control logic configured to select between (activate/inactivate) outputs for driving low-power (e.g., GaAs) T/R switches and outputs for driving high-power (e.g., PIN diode) T/R switches.

In one example, the output signals SW1A50, SW1B50, SW2A50, and SW2B50 may be configured to control PIN diode switches separate from (external to) a monolithic microwave integrated circuit (MMIC) implementing a T/R module, while the outputs SW3A1, SW3B1, SW4A1, and SW4B1 may be configured to control GaAs switches on the MMIC. The signals L1, L2, P1, and P2 may be used, in one example, to control amplifiers in the T/R module being driven by the circuit 100. For example, the signals L1 and L2 may be used to control separate stages of a low noise amplifier (LNA) section. The signals P1 and P2 may be used to control separate stages of a power amplifier (PA) section. In one example, the use of multiple control signals to control multiple amplifier stages may reduce the possibility of instability due to feedback between the amplifier stages. An idle state may be implemented (e.g., to eliminate loop oscillation). The circuit 100 may be configured to pass through the idle state when switching from transmit to receive and/or when switching from receive to transmit modes. During the idle state, the circuit 100 is enabled to disable the separate stages of the low noise amplifier (LNA) and power amplifier (PA) sections while drawing essentially no current.

Figure 2:
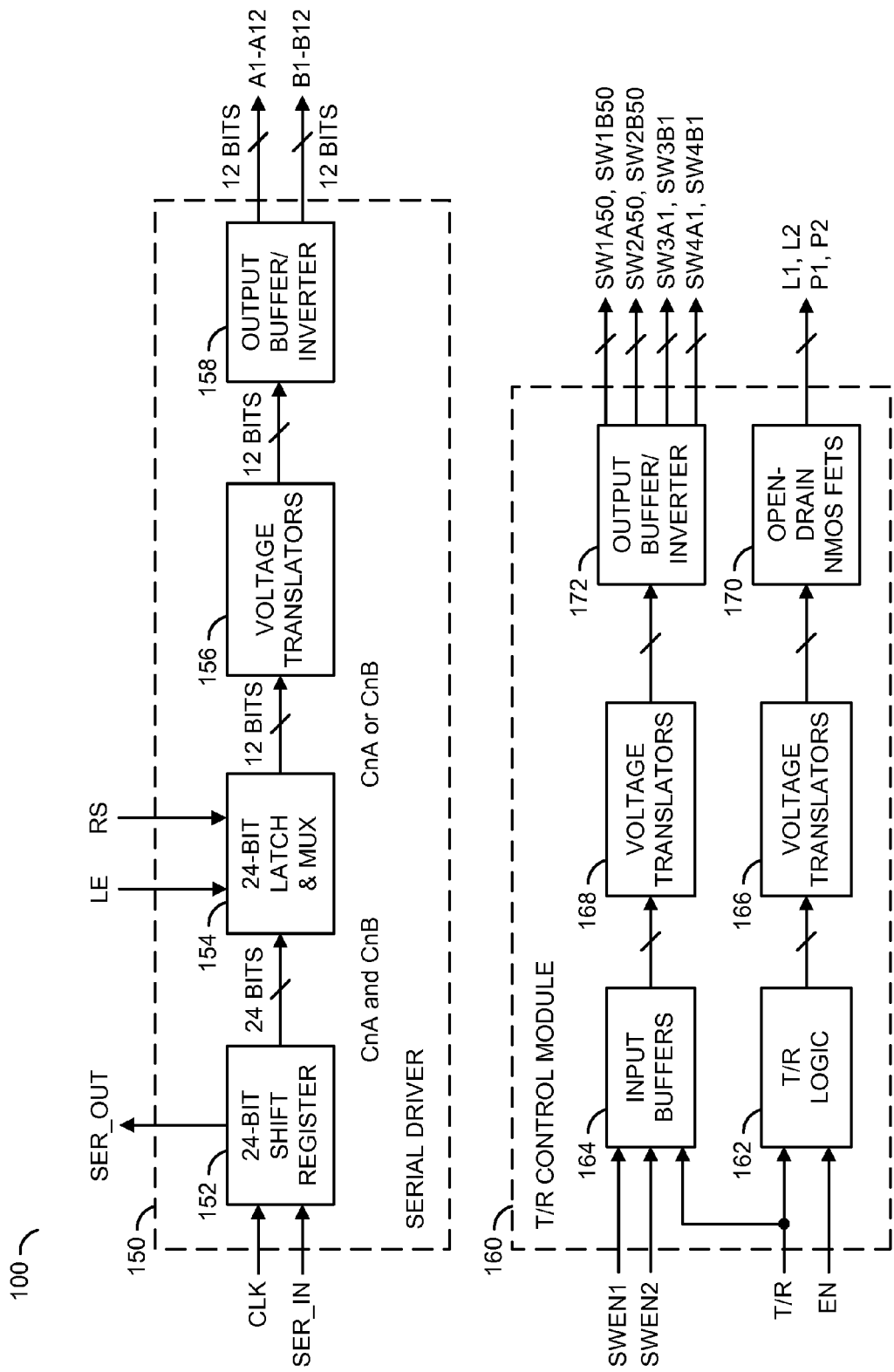
FIG. 2 is a block diagram illustrating an example implementation of a transmit/receive (T/R) module driver in accordance with an embodiment of the present invention.

Referring to FIG. 2, a block diagram is shown illustrating an example implementation of the circuit 100 of FIG. 1 in accordance with an embodiment of the present invention. In one example, the circuit 100 may comprise a block 150 and a block 160. The block 150 may implement a serial driver module. The block 160 may implement a T/R control module. The block 150 generally implements a serial control interface using the input 102 (e.g., CLK), the input 104 (e.g., SER_IN), the input 106 (e.g., RS), the input 108 (e.g., LE), and the serial output 118 (e.g., SER_OUT), the output 120 (e.g., the in phase outputs A1-A12), and the output 122 (e.g., the complementary outputs B1-B12). In one example, the serial control interface may be compatible with the SPI protocol.

In one example, when the serial control interface is activated, a serial word (e.g., 24 bits) may be loaded (e.g., MSB first) using the signal CLK. When the serial word has been loaded, the signal LE may be asserted (e.g., set to a logic HIGH, or 1) to latch (store) the data values (e.g., C1A-12A and C1B-C12B) contained in the serial word. When the signal LE is asserted, the signal CLK may be masked to prevent data transition during the data transfer. The signal RS may be set to select a particular control value (e.g., C1A-C12A or C1B-C12B) for presentation on the complementary outputs A1-A12 and B1-B12. The signal SER_OUT generally comprises the signal SER_IN delayed by a number of clock cycles equivalent to the word size implemented (e.g., 24 clock cycles for a 24-bit word).

The T/R control module 160 generally implements a T/R control interface using the input 110 (e.g., the signal EN), the input 112 (e.g., the signal T/R), the input 114 (e.g., the signal SWEN1), the input 116 (e.g., the signal SWEN2), and the outputs 124-138 (e.g., the signals SW1A50, SW1B50, SW2A50, SW2B50, SW3A1, SW3B1, SW4A1, SW4B1, L1, L2, P1, and P2). The output signals SW1A50, SW1B50, SW2A50, and SW2B50 are generally configured to drive high-current (e.g, 50 mA) switches configured to connect a multi-function module to high power RF circuits. For example, the signals SW1A50, SW1B50, SW2A50, and SW2B50 may be used to control single-pole, double-throw (SPDT) PIN diode switches in a radar system in order to switch between transmit and receive modes. The output signals SW3A1, SW3B1, SW4A1, and SW4B1 are generally configured to drive low-current (e.g., 1 mA) switches that are part of a multi-function module. For example, the signals SW3A1, SW3B1, SW4A1, and SW4B1 may be used to control GaAs single-pole, double-throw (SPDT) T/R switches in a T/R module in order to switch between transmit and receive modes.

The T/R control module 160 may be further configured to use a combination of the input signals EN and T/R to implement power consumption control. For example, the T/R control module 160 may control the output signals L1, L2, P1 and P2 based upon the combination of one or more bits of the input signals EN and T/R. The output signals L1, L2, P1 and P2 may then be utilized to turn on/off subsequent circuitry. For example, the signals L1, L2, P1 and P2 may be configured to turn on/off receive path LNAs and transmit path PAs in a T/R module. In one example, the signals L1, L2, P1 and P2 may be implemented with open-drain negative-doped metal oxide semiconductor (NMOS) field effect transistors (FETs). When one of the NMOSFETs is turned on, the NMOSFET may be configured to pull up a gate of a GaAs FET in an amplifier to turn the amplifier on. The biasing of the gate of the GaAs FET may be controlled by a bias circuit that may be implemented separately from (external to) the circuit 100. When the NMOSFETs are turned off, the outputs may provide a high impedance mode in which no current is used. In one example, the signals L1, L2, P1 and P2 may be used to control up to four LNA stages and four PA stages. In one example, the T/R control module 160 may include logic and/or a look-up table (LUT).

In one example, the block 150 may comprise a block (or circuit) 152, a block (or circuit) 154, a block (or circuit) 156, and a block (or circuit) 158. In one example, the block 160 may comprise a block (or circuit) 162, a block (or circuit) 164, a block (or circuit) 166, a block (or circuit) 168, a block (or circuit) 170, and a block (or circuit) 172. The block 152 may be implemented, in one example, as a 24-bit shift register. The block 154 may be implemented, in one example, as a 24-bit input latch and multiplexer circuit. The block 156 may be implemented, in one example, as a voltage translator. The block 158 may be implemented, in one example, as an output buffer/inverter block. The block 162 may be implemented as a control logic. The block 164 may implement an input buffer circuit. The blocks 166 and 168 may implement voltage translators. The block 170 may be implemented, in one example, as a number of open-drain NMOSFETs. The block 172 may implement a number of output buffers/inverters. In some embodiments, the blocks 162 and 164 may be implemented as a single T/R logic block and the blocks 166 and 168 may be implemented as a single voltage translator block.

The block 152 may have a first input that may receive the signal CLK, a second input that may receive the signal SER_IN, a first output that may present the signal SER_OUT, and a second output that may present a number of parallel signals (e.g., CnA and CnB, where n represents the number of bits) to a first input of the block 154. The block 154 may have a second input that may receive the signal LE, a third input that may receive the signal RS, and an output that may present a number of bits to an input of the block 156. In one example, the block 154 may be configured to latch (store) the values of the parallel signals (e.g., CnA and CnB) in response to the signal LE being asserted. Depending on the value (state) of the signal RS, the output of the block 154 presents the bits of a predefined portion of the latched parallel signals (e.g., either the signal CnA or the signal CnB in the current example). The block 156 may have an output that may present a number of signals to an input of the block 158. The block 158 may have a number of first outputs that may present the signals A1-A12 and a number of second outputs that may present the signals B1-B12.

The block 162 may have a first input that may receive the signal EN and a second input that may receive the signal T/R. The block 164 may have a first input that may receive the signal T/R, a second input that may receive the signal SWEN1, and a third input that may receive the signal SWEN2. An output of the block 162 may present a number of signals to an input of the block 166. An output of the block 164 may present a number of signals to an input of the block 168. In one example, the blocks 162 and 164 may implement logic and/or a look-up table (LUT) configured to determine output values in response to the input signals. The block 166 may have an output that may present a number of signals to an input of the block 170. The block 168 may have an output that may present a number of signals to an input of the block 172. The block 170 may have a number of outputs that may present the signals L1, L2, P1 and P2. The block 172 may have a number of outputs that may present the signals SW1A50, SW1B50, SW2A50, SW2B50, SW3A1, SW3B1, SW4A1, and SW4B1.

Figure 3:
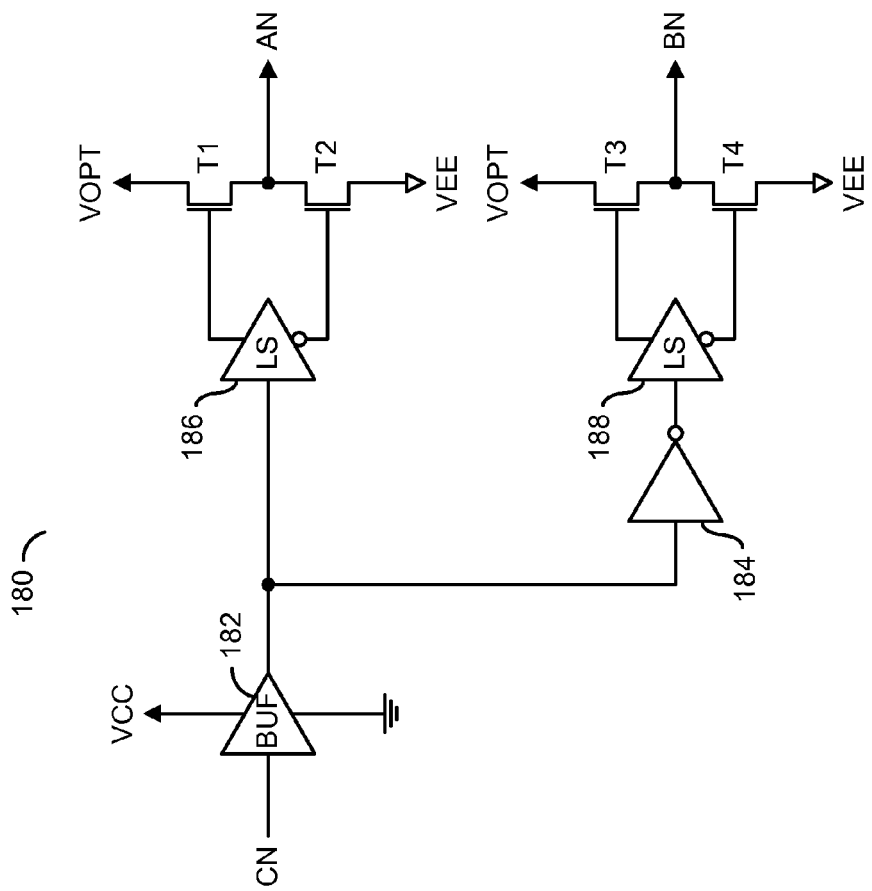
FIG. 3 is a diagram illustrating a functional schematic for one bit of a serial driver circuit of FIG. 2.

Referring to FIG. 3, a diagram of a circuit 180 is shown illustrating a 1-bit path of the serial driver circuit 150 of FIG. 2. The circuit 180 generally represents a function schematic of a pathway by which the serial driver circuit 150 of FIG. 2 generates each of the signals A1-A12 and B1-B12 in response to signals C1A-C12A or C1B-C12B. The circuit 180 generally comprises a block (or circuit) 182, a block (or circuit) 184, a block (or circuit) 186, a block (or circuit) 188, and a number of transistors T1-T4. The block 182 generally represents CMOS (complimentary metal oxide semiconductor) circuitry that may, in one example, be used to implement the blocks 152 and 154. The block 184 generally represents an inverter function that may be used to generate a complement of a signal. In one example, the blocks 182 and 184 may be combined as a combination of inverting and non-inverting input buffers. The blocks 186 and 188 generally represent the voltage translator (or level shifting) module 156 of the serial driver circuit 150. The transistors T1-T4 generally represent the output buffer/inverter block 158 of the serial driver circuit 150.

In an example operation, an input signal (e.g., CN) is presented to an input of the input buffer portion of the block 182. The block 182 generates an output that is presented to an input of the block 184 and an input of the block 186. The block 184 generally inverts (complements) the received signal and presents the complemented signal to an input of the block 188. The blocks 186 and 188 generally shift the received signals to a voltage level appropriate for driving the pairs of transistors T1 and T2, and T3 and T4, respectively. The transistors T1 and T2 are generally configured to generate an output signal (e.g., AN) in response to a first supply voltage (e.g., VOPT) and a second supply voltage (e.g., VEE). The transistors T3 and T4 are configured to generate an output signal (e.g., BN) in response to the power supplies VOPT and VEE. In some embodiments, the supply voltage VOPT may be implemented as ground (e.g., GND). Other supply voltages may be implemented accordingly to meet the design criteria of a particular implementation. The output signal AN generally tracks the input signal CN. The output BN is generally a complement of the input signal CN. Multiple instances of the circuit 180 may be implemented to generate the signals A1-A12 and B1-B12 shown in FIG. 2.

As illustrated by the circuit 180, the serial driver circuit 150 is generally configured to translate logic level (e.g., TTL, CMOS, LVCMOS, etc.) control inputs into negative gate control voltages appropriate for gallium arsenide (GaAs) FET microwave switches, phase shifters, and attenuators. In one example, the serial driver circuit 150 may be implemented using high speed analog CMOS technology to achieve low power dissipation at moderate to high speeds. The serial driver circuit 150 may be implemented to encompass most microwave switching applications. In some embodiments, the signals A1-A12 and B1-B12 may be implemented with an output HIGH level in the range of 0-2 volts relative to ground (GND). The range of 0-2 volts relative to ground may optimize the intermodulation products of GaAs FET control devices at low frequencies.

Figure 4:
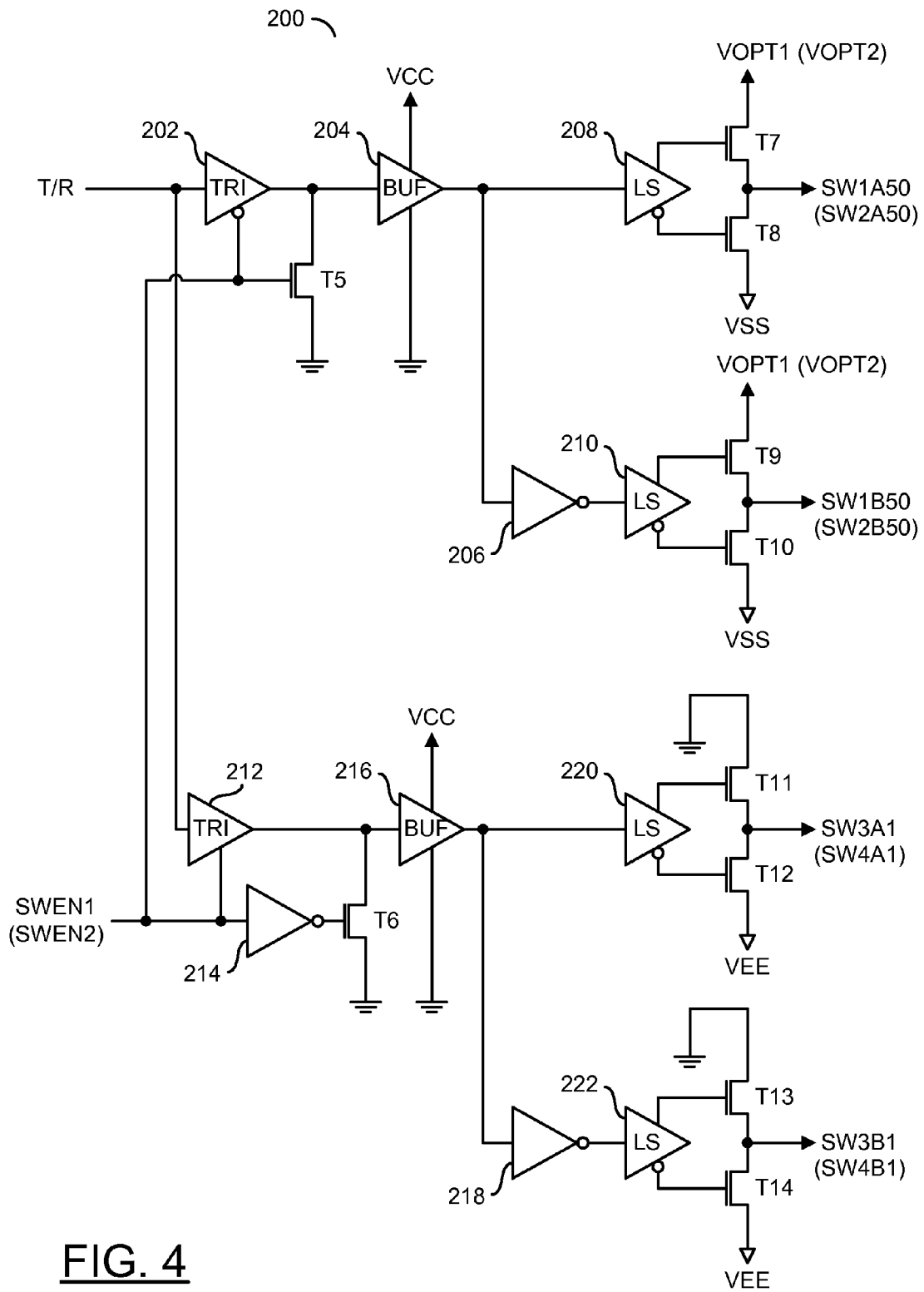
FIG. 4 is a diagram illustrating a functional schematic for one bit of a T/R control circuit of FIG. 2.

Referring to FIG. 4, a diagram of a circuit 200 is shown illustrating a pair of buffer outputs of the T/R control circuit 160 of FIG. 2. The circuit 200 generally represents a function schematic of a pathway by which the T/R control circuit 160 of FIG. 2 generates the signals SW1A50, SW1E50, SW3A1, and SW3B1 in response to the signals SWEN1 and T/R. The signals SW2A50, SW2B50, SW4A1, and SW4B1 are generated in response to the signals SWEN2 and T/R using a similar circuit (as shown in parentheses). The circuit 200 generally comprises a block (or circuit) 202, a block (or circuit) 204, a block (or circuit) 206, a block (or circuit) 208, a block (or circuit) 210, a block (or circuit) 212, a block (or circuit) 214, a block (or circuit) 216, a block (or circuit) 218, a block (or circuit) 220, a block (or circuit) 222, and a number of transistors T5-T14. The blocks 202-206 and 212-218 generally represent CMOS input buffer circuitry that may, in one example, be used to implement the block 164. The blocks 206, 214 and 218 generally represents an inverter function that may be used to generate a complement of a signal. In one example, the blocks 204, 206, 216, and 218 may be combined as a combination of inverting and non-inverting input buffers. The blocks 208, 210, 220, and 222 generally represent the voltage translator module 168 of the T/R control circuit 160. The transistors T7-T14 generally represent the output buffer/inverter block 172 of the T/R control circuit 160.

In one example, the block 202 is implemented as an active-low three-state input buffer and the block 212 is implemented as an active-high three-state input buffer. In an example operation, the signal T/R is presented to an input of the block 202 and an input of the block 212. The signal SWEN1 is presented to a control input of the block 202, a control input of the block 212, a gate terminal of the transistor T5, and an input of the block 214. The block 202 generates an output that is presented to an input of the block 204. The drain/source of the transistor T5 is connected between the input of the block 204 and ground. An output of the block 214 is presented to a gate terminal of the transistor T6. The block 212 generates an output that is presented to an input of the block 216. The drain/source of the transistor T6 is connected between the input of the block 216 and ground.

The block 204 generates an output that is presented to an input of the block 206 and an input of the block 208. The block 206 generally inverts (complements) the received signal and presents the complemented signal to an input of the block 210. The blocks 208 and 210 generally shift the received signals to a voltage level appropriate for driving the complementary pairs of transistors T7 and T8, and T9 and T10, respectively. The transistors T7 and T8 are generally configured to generate the output signal SW1A50 in response to a respective supply voltage (e.g., VOPT1) and the supply voltage VSS. The transistors T9 and T10 are configured to generate the output signal SW1B50 in response to the power supplies VOPT1 and VSS.

The block 216 generates an output that is presented to an input of the block 218 and an input of the block 220. The block 218 generally inverts (complements) the received signal and presents the complemented signal to an input of the block 222. The blocks 220 and 222 generally shift the received signals to a voltage level appropriate for driving the complementary pairs of transistors T11 and T12, and T13 and T14, respectively. The transistors T11 and T12 are generally configured to generate the output signal SW3A1 in response to the ground potential GND and a supply voltage VEE. The transistors T13 and T14 are configured to generate the output signal SW3B1 in response to the ground potential and the supply voltage VEE. The transistors T7-T10 are generally implemented larger and with higher voltage ratings than the transistors T11-T14. Other supply voltages may be implemented accordingly to meet the design criteria of a particular implementation.

As illustrated by the circuit 200, the T/R control circuit 160 is generally configured to translate logic level (e.g., TTL, CMOS, LVCMOS, etc.) control inputs into negative gate control voltages appropriate for gallium arsenide (GaAs) FET microwave switches and PIN diode switches. In one example, the T/R control circuit 160 may be implemented using high speed analog CMOS technology to achieve low power dissipation at moderate to high speeds. The T/R control circuit 160 may be implemented to encompass most microwave switching applications. In some embodiments, the signals SW3A1, SW3B1, SW4A1, and SW4B1 may be implemented with an output HIGH level in the range of 0-2 volts relative to ground (GND). The range of 0-2 volts relative to ground may optimize the intermodulation products of GaAs FET control devices at low frequencies.

For driving higher power devices (e.g., PIN diode circuits), the outputs SW1A50, SW1B50, SW2A50, and SW2B50 may be switched between +5 and −5 volts, or switched between +5 and −10 volts. The voltage range implemented may be selected to meet the design criteria of a particular application. The actual driver output voltages may be lower when driving large currents due to resistance of the output devices (e.g., represented by the transistors T7-T14). In one example, the transistors T11-T14 may be tied to the supply voltages set between 1.0 and 2.0 volts relative to ground (GND) to improve the intermodulation performance and the 1 dB compression point of GaAs control devices at low frequencies.

Figure 5:
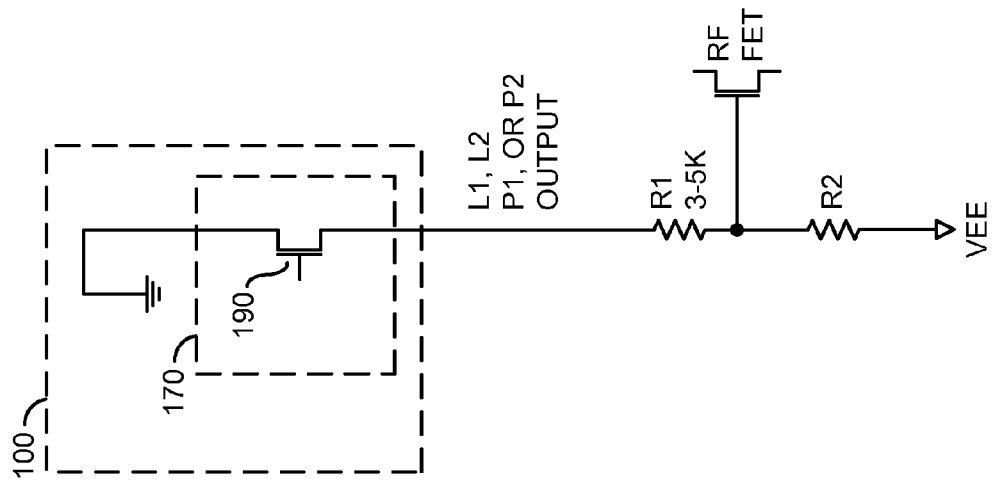
FIG. 5 is a diagram illustrating an application circuit for controlling a T/R amplifier utilizing an open-drain NMOSFET output of the T/R module driver of FIG. 2.

Referring to FIG. 5, a diagram is shown illustrating an example of an external bias circuit that may be implemented when controlling a T/R amplifier utilizing one of the open-drain NMOSFETs outputs of the T/R control module 160 of FIG. 2. Open-drain NMOSFETs 190 of the module 170 generally provide the signals L1, L2, P1 and P2 presented at the outputs 132-138 of the T/R module driver 100. When the open-drain NMOSFETs 190 are turned on, the respective outputs 132-138 may be used, for example, to pull up a gate voltage of a GaAs FET in an amplifier of a T/R module (or other device) attached to the T/R module driver 100. Depending on the state (on or off) of the NMOSFET, a channel of the GaAs FET is either turned on or pinched off. In one example, each of the output signals L1, L2, P1 and/or P2 may be generated by a corresponding open-drain NMOSFET 190. In one example, a source of the NMOSFETs 190 is tied to ground (GND) internally and a drain of the NMOSFETs 190 is tied to one of the outputs 132-138. Each of the outputs 132-138 may be connected to an external voltage divider formed using a resistor R1 and a resistor R2 and connected to a supply voltage (e.g., VEE). The voltage divider may be used to set a bias level of the gate of the GaAs FET in the device to be controlled when the open-drain NMOSFET 190 is conducting (or turned ON). When the amplifier is disabled (e.g., the open-drain NMOSFET 190 is not conducting, or turned OFF) no current flows.

Referring to FIG. 6, a truth table, TABLE 1, is shown illustrating an example operation of the circuit 160 of FIG. 2 when configured as shown in FIGS. 3-5.

Figure 7:
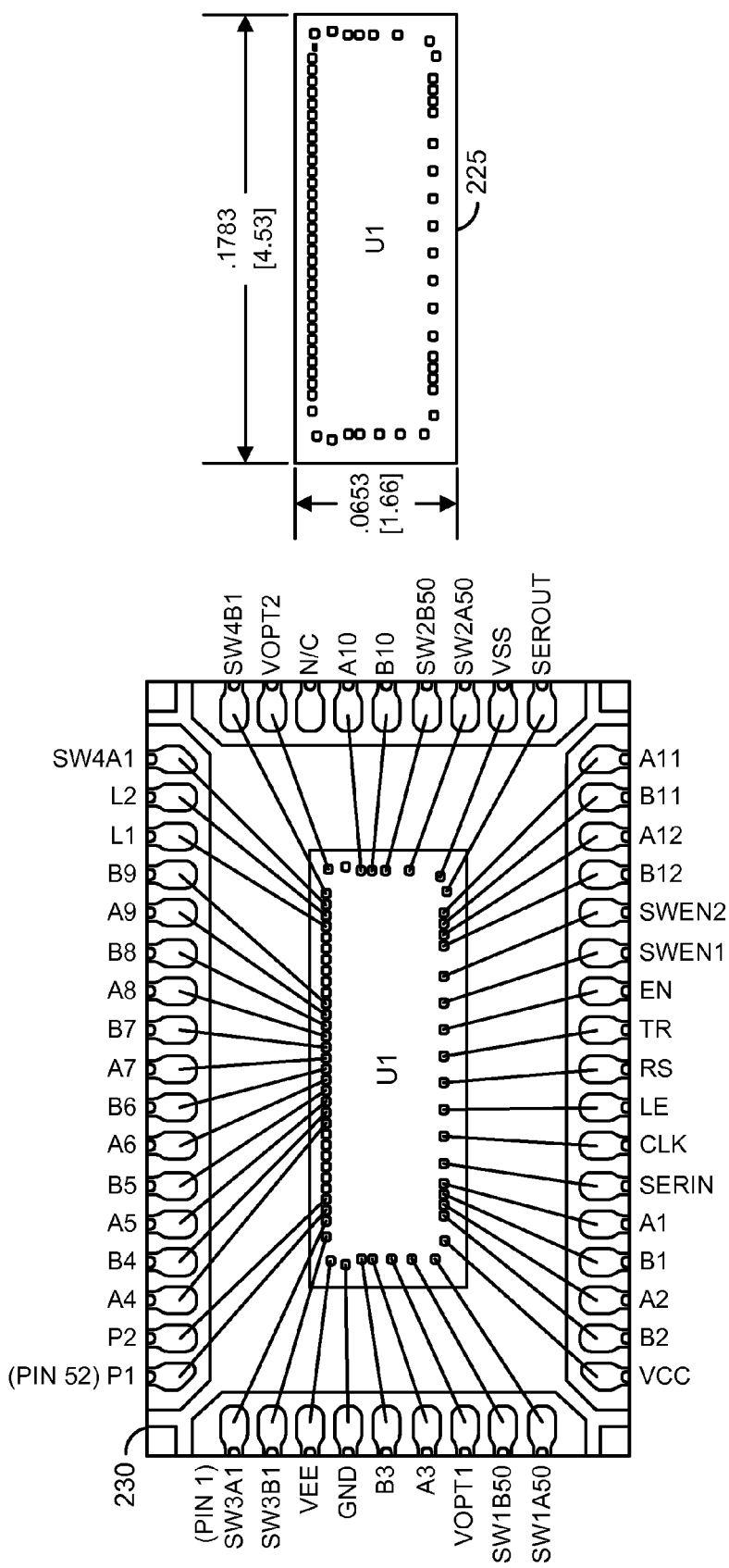
FIG. 7 is a diagram illustrating a package in which an integrated circuit implementing a T/R module driver in accordance with an embodiment of the present invention may be mounted.

Referring to FIG. 7, a diagram is shown illustrating an integrated circuit implementing a T/R module driver in accordance with an embodiment of the present invention and a package in which the integrated circuit may be mounted. In one example, the T/R module driver 100 may be implemented as a monolithic integrated circuit (U1) 225. In one example, the monolithic integrated circuit 225 may be packaged in a 5×8 mm PQFN-52LD package 230.

Figure 8:
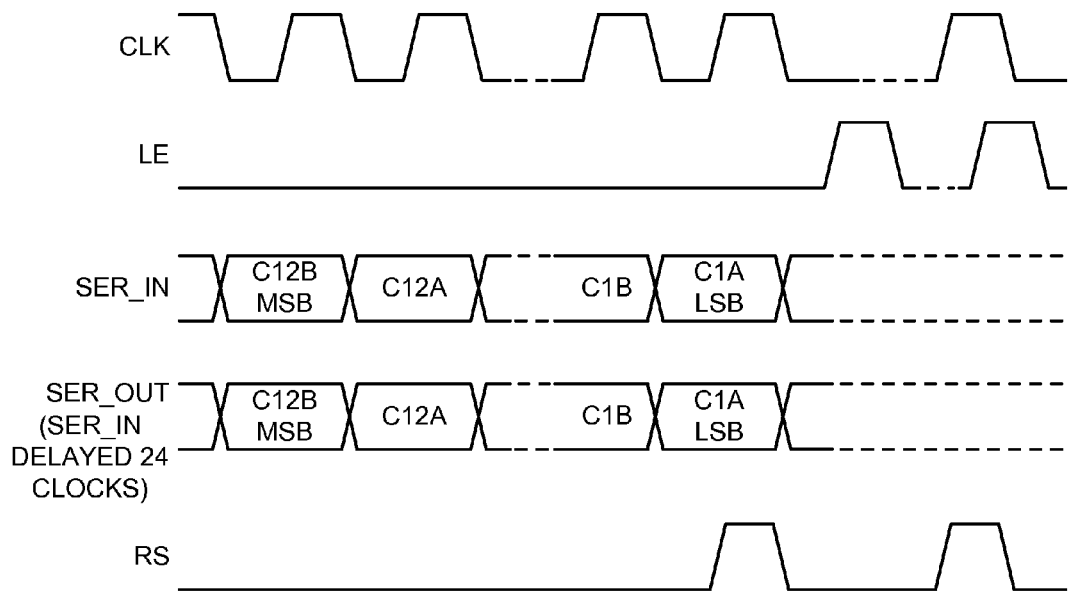
FIG. 8 is a timing diagram illustrating operation of a serial interface of a T/R module driver in accordance with an embodiment of the present invention.

Referring to FIG. 8, a timing diagram is shown illustrating operation of a serial interface of the T/R module driver 100 of FIG. 1. In one example, a serial word (e.g., 24 bits) may be loaded (e.g., MSB first) using the signal CLK. For example, data bits contained in the signal SER_IN may be sampled on a rising edge of the signal CLK. When the serial word has been loaded, the signal LE may be asserted (e.g., set to a logic HIGH, or 1) to latch (transfer) the data for presentation on the complementary outputs A1-A12 and B1-B12. When the signal LE is asserted, the signal CLK may be masked to prevent data transition during the data transfer. The signal SER_OUT generally comprises the signal SER_IN delayed by a number of clock cycles equivalent to the word size implemented (e.g., 24 clock cycles for a 24-bit word).

Figure 9:
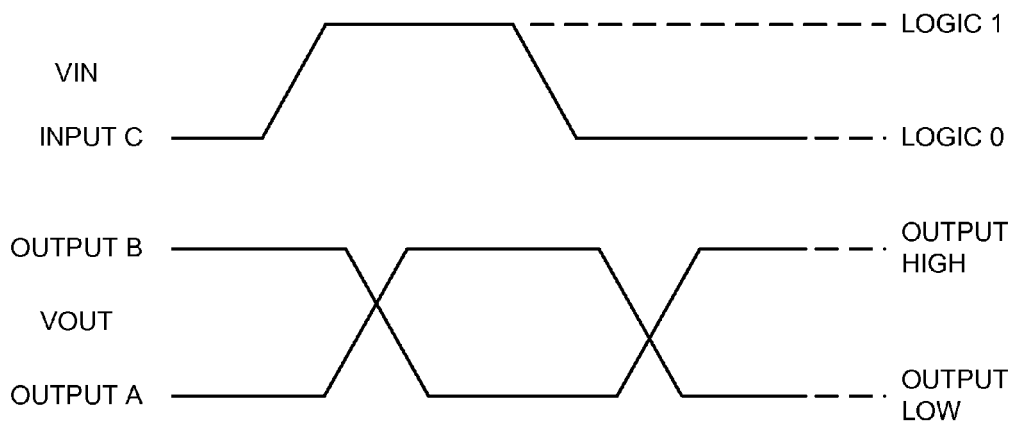
FIG. 9 is a timing diagram illustrating switching waveforms between an input interface and an output interface of a T/R module driver in accordance with an embodiment the present invention.

Referring to FIG. 9, a timing diagram is shown illustrating timing relationships between the latched input signals (e.g., C1A-C12A and C1B-C12B) and the parallel output signals (e.g., A1-A12 and B1-B12) of the circuit 100 of FIG. 1. In one example, the logic levels of latched input signals C1A-C12A and C1B-C12B may be altered in response to the signal LE. The output signals A1-A12 and B1-B12 may be configured to swing between a high output voltage level and a low output voltage level. The particular level of each signal A1-A12 and B1-B12 is determined by the latched input signals selected by the signal RS. The output signals are generally switched between voltage levels other than the levels of the input signals. For example, the output signals A1-A12 and B1-B12 may switch between GND as the high output voltage level and VEE as the low output voltage level. However, other voltage levels may be implemented accordingly to meet the design criteria of a particular implementation.

Referring to FIG. 10, a diagram is shown illustrating a multi-chip module (package) in which an integrated circuit implementing a T/R module driver in accordance with an embodiment of the present invention and an integrated circuit implementing T/R module may be mounted. In one example, the T/R module may be implemented as a monolithic integrated circuit (U1) 232 and the T/R module driver 100 may be implemented as a monolithic integrated circuit (U2) 234. In one example, the monolithic integrated circuits 232 and 234 may be packaged in a 7 mm PQFN-44LD package 240.

Figure 11:
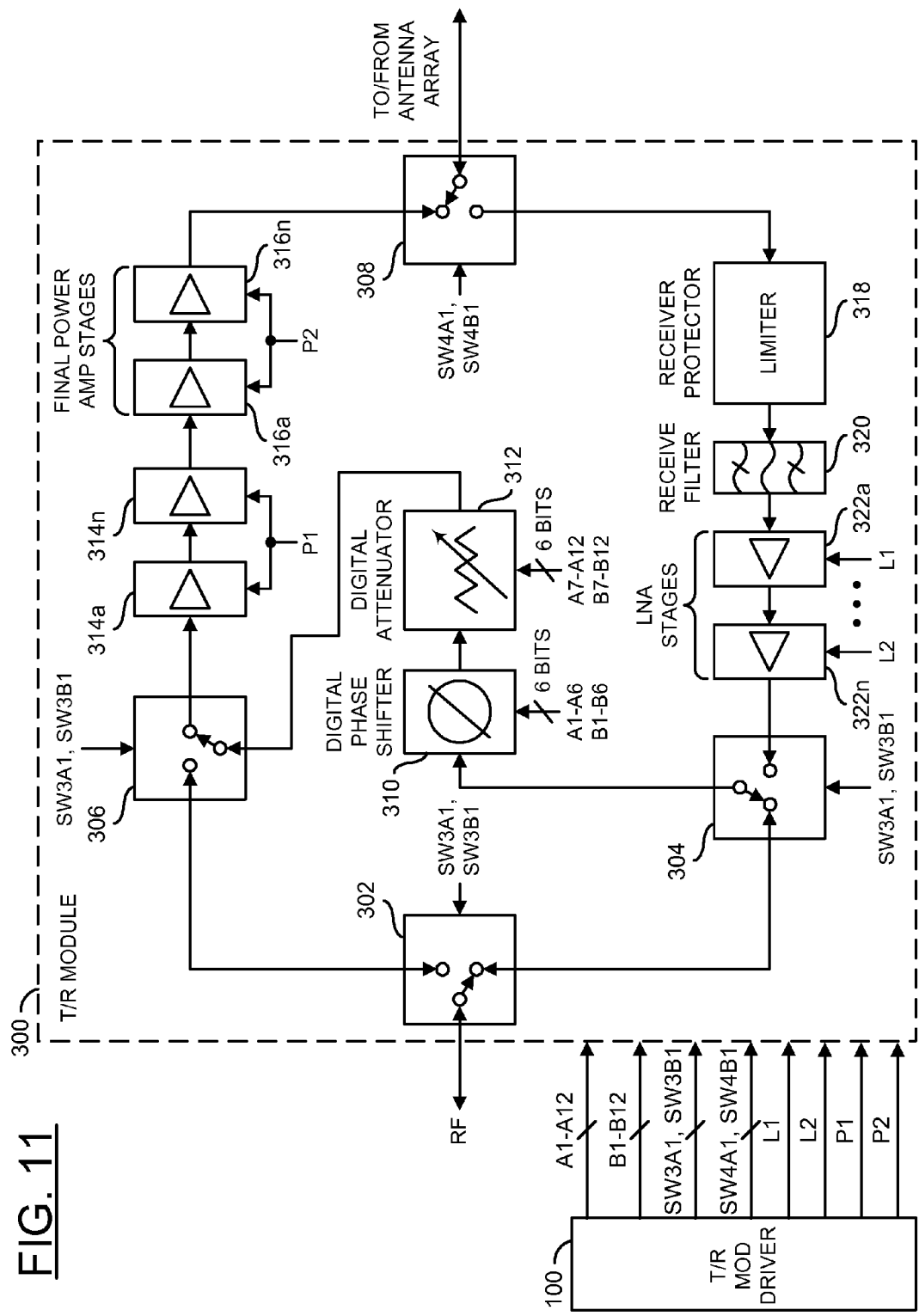
FIG. 11 is a diagram illustrating a T/R module driver in accordance with an embodiment of the present invention implemented in conjunction with an example GaAs T/R module in a radar system.

Referring to FIG. 11, a diagram is shown illustrating a context in which a T/R module driver in accordance with an embodiment of the present invention is implemented with a monolithic T/R module. In one example, the T/R module driver 100 may be connected with a monolithic T/R module 300. In one example, the T/R module 300 may be part of a radar system. However, other RF transmit/receive systems (e.g., cellular phone system, WiFi, etc.) may be implemented accordingly. In various embodiments, the T/R module 300 may comprise a module (or circuit) 302, a module (or circuit) 304, a module (or circuit) 306, a module (or circuit) 308, a module (or circuit) 310, a module (or circuit) 312, a number of modules (or circuits) 314a-314n, a number of modules (or circuits) 316a-316n, a module (or circuit) 318, a module (or circuit) 320, and a number of modules (or circuits) 322a-322n.

The modules 302-308 may be implemented as transmit/receive (T/R) switches. The module 310 may be implemented as a digital phase shifter. The module 312 may be implemented as a digital attenuator. The modules 314a-314n may implement power amplifier (PA) stages of a transmit path of the T/R module 300. The modules 316a-316n may implement final power amplifier (PA) stages of the transmit path of the T/R module 300. The module 318 may implement a limiter configured to provide protection for a receiver path of the T/R module 300. The module 320 may implement a receive filter. The modules 322a-322n may implement low noise amplifier (LNA) stages of the receive path of the T/R module 300. The T/R module 300 may be configured to receive the signals A1-A12, B1-B12, SW3A1, SW3B1, SW4A1, SW4B1, L1, L2, P1, and P2 from the T/R module driver 100. In one example, the signals SW3A1 and SW3B1 may be used to control the T/R switch modules 302, 304, and 306 and the signals SW4A1 and SW4B1 may be used to control the T/R switch module 308 to select between transmit and receive modes of the T/R module 300. Even though a unidirectional arrow is depicted in the T/R switch modules 302, 304, 306 and 308, signals may flow in either direction, as is needed to transmit and receive.

The transmit path of the T/R module 300 generally begins at the T/R switch module 302. When the T/R switch modules 302, 304, 306, and 308 are set to the transmit mode by the signals SW3A1, SW3B1, SW4A1, and SW4B1, an RF signal may flow across the T/R switch module 302 from an RF input/output connection to the T/R switch module 304, and then to the module 310. The RF signal may be phase shifted by the module 310. In one example, the module 310 may implement a variable phase shifter. For example, the module 310 may be configured to implement a number of bits (e.g., 6) of phase shift (e.g., 5.6° steps). However, other numbers of bits may be implemented accordingly to meet the design criteria of a particular implementation. The amount of phase shift may be determined, in one example, using the signals A1-A6 and B1-B6. After the RF signal is phase shifted, the RF signal may be attenuated by the module 312. In one example, the module 312 may implement a variable resistance. For example, the module 312 may be configured to implement a number of bits (e.g., 6) of attenuation. The amount of attenuation may be determined, in one example, using the signals A7-A12 and B7-B12. However, other numbers of bits may be implemented accordingly to meet the design criteria of a particular implementation. The modules 310 and 312 may implement the same or a different number of bits. For example, fine grained phase shift and attenuation may be employed to make small adjustments to a shape of an RF signal transmitted by an antenna array connected to the T/R module 300.

After being shifted and attenuated, the RF signal may exit the module 312 and continue to the power amplifier (PA) stages 314a-314n and 316a-316n via the module 306. In one example, the transmit path of the T/R module 300 may have four gain stages. However, other numbers of gain stages may be implemented accordingly to ensure that the transmitted signal has the requisite signal strength. The power amplifier stage 316n outputs the amplified RF signal to the T/R switch module 308, where the amplified RF signal is routed to an antenna or antenna array connected to the T/R module 300. The T/R switch module 308 is generally implemented as a high power switch that connects the antenna or antenna array to either the transmit path or to the receive path of the T/R module 300 (e.g., generally determined by the signals SW4A1 and SW4B1). In one example, the T/R switch module 308 may be integrated with the final power amplifier stages 316a-316n.

The receive path of the T/R module 300 generally begins where the T/R switch module 308 connects to the lead from the antenna or antenna array. The receive path continues through the module 318 and the module 320 to the modules 322a-322n. The module 318 generally limits the received RF signal to protect the receiver circuitry. The module 320 generally provides filtering of the received RF signal. The modules 322a-322n generally provide a number of gain stages forming a low noise amplifier (LNA). A low noise amplifier (LNA) is generally used to amplify the RF signal received by the antenna array, to increase the signal strength while minimizing added noise, prior to feeding the RF signal into other circuit components. A LNA is a type of amplifier that is optimized to produce as little noise as possible while still meeting amplification requirements for the signal. An output of the module 322n flows across the T/R switch module 304 to the module 310.

The modules 302, 304, 306, 310, and 312 generally perform the same function on the received signals as performed on the transmitted signals. In one example, a series of gain stages (not shown) may be implemented in conjunction with the modules 310 and 312. For example, gain stages may be implemented before, between and/or after the modules 310 and 312. Because gain stages operate in only one direction, the T/R switch modules 304 and 306 are configured to ensure the signals passing through the common leg (e.g., modules 310 and 312) are traveling in the appropriate direction. The output of the module 312 may travel across the T/R switch module 306 to the T/R switch module 302, and then to the RF input/output connection of the T/R module 300.

The signals L1, L2, P1, and/or P2 may be used to reduce power dissipation of the T/R module 300 by disabling (e.g., shutting down) one or more of the power amplifier stages of the transmit path or the low noise amplifier stages of the receive path depending upon whether the T/R module is in the transmit or receive mode. For example, the signal P1 may be used to enable/disable the modules 314a-314n, the signal P2 may be used to enable/disable the modules 316a-316n, the signal L1 may be used to enable/disable a first portion of the modules 322a-322n, and the signal L2 may be used to enable/disable a second portion of the modules 322a-322n. The signals L1 and L2 may be configured to control the operation of the low noise amplifier (LNA) stages 322a-322n in the receive path to reduce power dissipation during operation of the T/R module 300 in the transmit mode. The signals P1 and P2 may be configured to control operation of the power amplifier (PA) stages 314a-314n and 316a-316n in the transmit path to reduce power dissipation during operation of the T/R module 300 in the receive mode. By splitting the power and low noise amplifiers into stages and controlling the stages by separate signals, feedback paths may be eliminated that could lead to instability. For example, there would be a risk of feedback through the L1 control circuit causing oscillations if too many stages are controlled by the came control line. When switching between transmit and receive or receive and transmit modes, a period in an idle state (e.g., both transmit and receive functions disabled) may be provided to prevent potentially catastrophic loop oscillations.

Figure 12:
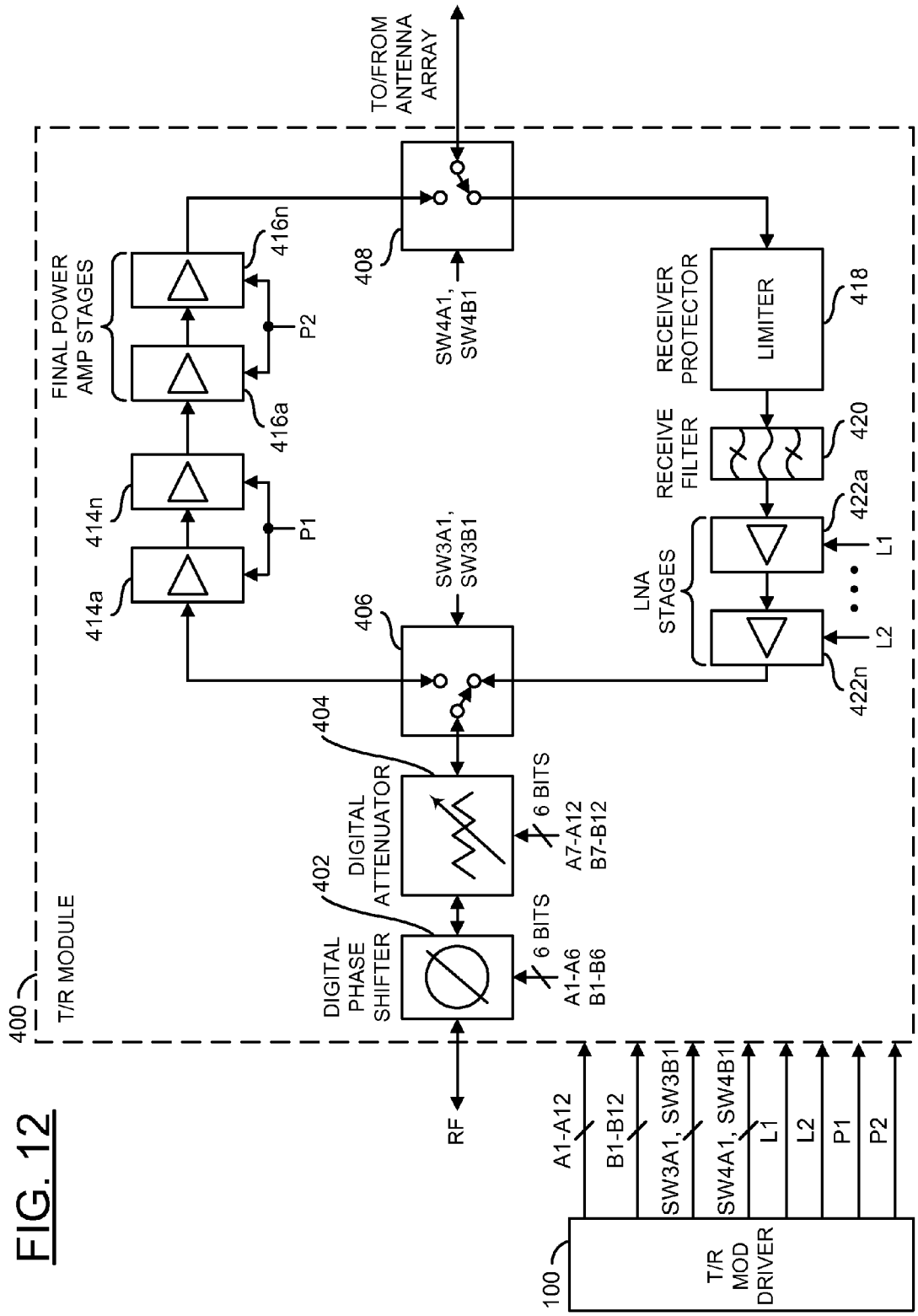
FIG. 12 is a diagram illustrating a T/R module driver in accordance with an embodiment of the present invention implemented in conjunction with another example GaAs T/R module in a radar system.

Referring to FIG. 12, a diagram is shown illustrating another context in which a T/R module driver in accordance with an embodiment of the present invention is implemented with a monolithic T/R module. In one example, the T/R module driver 100 may be connected with a monolithic T/R module 400. In one example, the T/R module 400 may be part of a radar system. However, other RF transmit/receive systems (e.g., cellular phone system, WiFi, etc.) may be implemented accordingly. In various embodiments, the T/R module 400 may comprise a module (or circuit) 402, a module (or circuit) 404, a module (or circuit) 406, a module (or circuit) 408, a number of modules (or circuits) 414a-414n, a number of modules (or circuits) 416a-416n, a module (or circuit) 418, a module (or circuit) 420, and a number of modules (or circuits) 422a-422n.

The module 402 may be implemented as a digital phase shifter. The module 404 may be implemented as a digital attenuator. The modules 406 and 408 may be implemented as transmit/receive (T/R) switches. The modules 414a-414n may implement power amplifier (PA) stages of a transmit path of the T/R module 400. The modules 416a-416n may implement final power amplifier (PA) stages of the transmit path of the T/R module 400. The module 418 may implement a limiter configured to provide protection for a receiver path of the T/R module 400. The module 420 may implement a receive filter. The modules 422a-422n may implement low noise amplifier (LNA) stages of the receive path of the T/R module 400. The T/R module 400 may be configured to receive the signals A1-A12, B1-B12, SW3A1, SW3B1, SW4A1, SW4B1, L1, L2, P1, and P2 from the T/R module driver 100. In one example, the signals SW3A1 and SW3B1 may be used to control the T/R switch module 406 and the signals SW4A1 and SW4B1 may be used to control the T/R switch module 408 to select between transmit and receive modes of the T/R module 400. Even though a unidirectional arrow is depicted in the T/R switch modules 406 and 408, signals may flow in either direction, as is needed to transmit and receive.

The transmit path of the T/R module 400 generally begins with the module 402. The RF signal may be phase shifted by the module 402. In one example, the module 402 may implement a variable phase shifter. For example, the module 402 may be configured to implement a number of bits (e.g., 6) of phase shift (e.g., 5.6° steps). However, other numbers of bits may be implemented accordingly to meet the design criteria of a particular implementation. The amount of phase shift may be determined, in one example, using the signals A1-A6 and B1-B6. After the RF signal is phase shifted, the RF signal may be attenuated by the module 404. In one example, the module 404 may implement a variable resistance. For example, the module 404 may be configured to implement a number of bits (e.g., 6) of attenuation. The amount of attenuation may be determined, in one example, using the signals A7-A12 and B7-B12. However, other numbers of bits may be implemented accordingly to meet the design criteria of a particular implementation. The modules 402 and 404 may implement the same or a different number of bits. For example, fine grained phase shift and attenuation may be employed to make small adjustments to a shape of an RF signal transmitted by an antenna array connected to the T/R module 400.

After being shifted and attenuated, the RF signal may exit the module 404 and continue to the T/R switch module 406. When the T/R switch modules 406 and 408 are set to the transmit mode by the signals SW3A1, SW3B1, SW4A1, and SW4B1, an RF signal may flow across the T/R switch module 406 from the module 404 to the power amplifier (PA) stages

414a-414n and 416a-416n. In one example, the transmit path of the T/R module 400 may have four gain stages. However, other numbers of gain stages may be implemented accordingly to ensure that the transmitted signal has the requisite signal strength. The power amplifier stage 416n outputs the amplified RF signal to the T/R switch module 408, where the amplified RF signal is routed to an antenna or antenna array connected to the T/R module 400. The T/R switch module 408 is generally implemented as a high power switch that connects the antenna or antenna array to either the transmit path or to the receive path of the T/R module 400 (e.g., generally determined by the signals SW4A1 and SW4B1). In some embodiments, the T/R switch module 408 may be integrated with the final power amplifier stages 416a-416n.

The receive path of the T/R module 400 generally begins where the T/R switch module 408 connects to the lead from the antenna or antenna array. The receive path continues through the module 418 and the module 420 to the modules 422a-422n. The module 418 generally limits the received RF signal to protect the receiver circuitry. The module 420 generally provides filtering of the received RF signal. The modules 422a-422n generally provide a number of gain stages forming a low noise amplifier (LNA). A low noise amplifier (LNA) is generally used to amplify the RF signal received by the antenna array, to increase the signal strength while minimizing added noise, prior to feeding the RF signal into other circuit components. A LNA is a type of amplifier that is optimized to produce as little noise as possible while still meeting amplification requirements for the signal. An output of the module 422n flows across the T/R switch module 406 to the modules 404 and 402. The modules 402 and 404 generally perform the same function on the received signals as performed on the transmitted signals. The output of the module 402 then travels to the RF input/output connection of the T/R module 400.

The signals L1, L2, P1, and/or P2 may be used to reduce power dissipation of the T/R module 400 by disabling (e.g., shutting down) one or more of the power amplifier stages of the transmit path or the low noise amplifier stages of the receive path depending upon whether the T/R module is in the transmit or receive mode. For example, the signal P1 may be used to enable/disable the modules 414a-414n, the signal P2 may be used to enable/disable the modules 416a-416n, the signal L1 may be used to enable/disable a first portion of the modules 422a-422n, and the signal L2 may be used to enable/disable a second portion of the modules 422a-422n. The signals L1 and L2 may be configured to control the operation of the low noise amplifier (LNA) stages 422a-422n in the receive path to reduce power dissipation during operation of the T/R module 400 in the transmit mode. The signals P1 and P2 may be configured to control operation of the power amplifier (PA) stages 414a-414n and 416a-416n in the transmit path to reduce power dissipation during operation of the T/R module 400 in the receive mode. By splitting the power and low noise amplifiers into stages and controlling the stages by separate signals, feedback paths may be eliminated that could lead to instability. For example, there would be a risk of feedback through the L1 control circuit causing oscillations if too many stages are controlled by the came control line. When switching between transmit and receive or receive and transmit modes, a period in an idle state (e.g., both transmit and receive functions disabled) may be provided to prevent potentially catastrophic loop oscillations.

Figure 13:
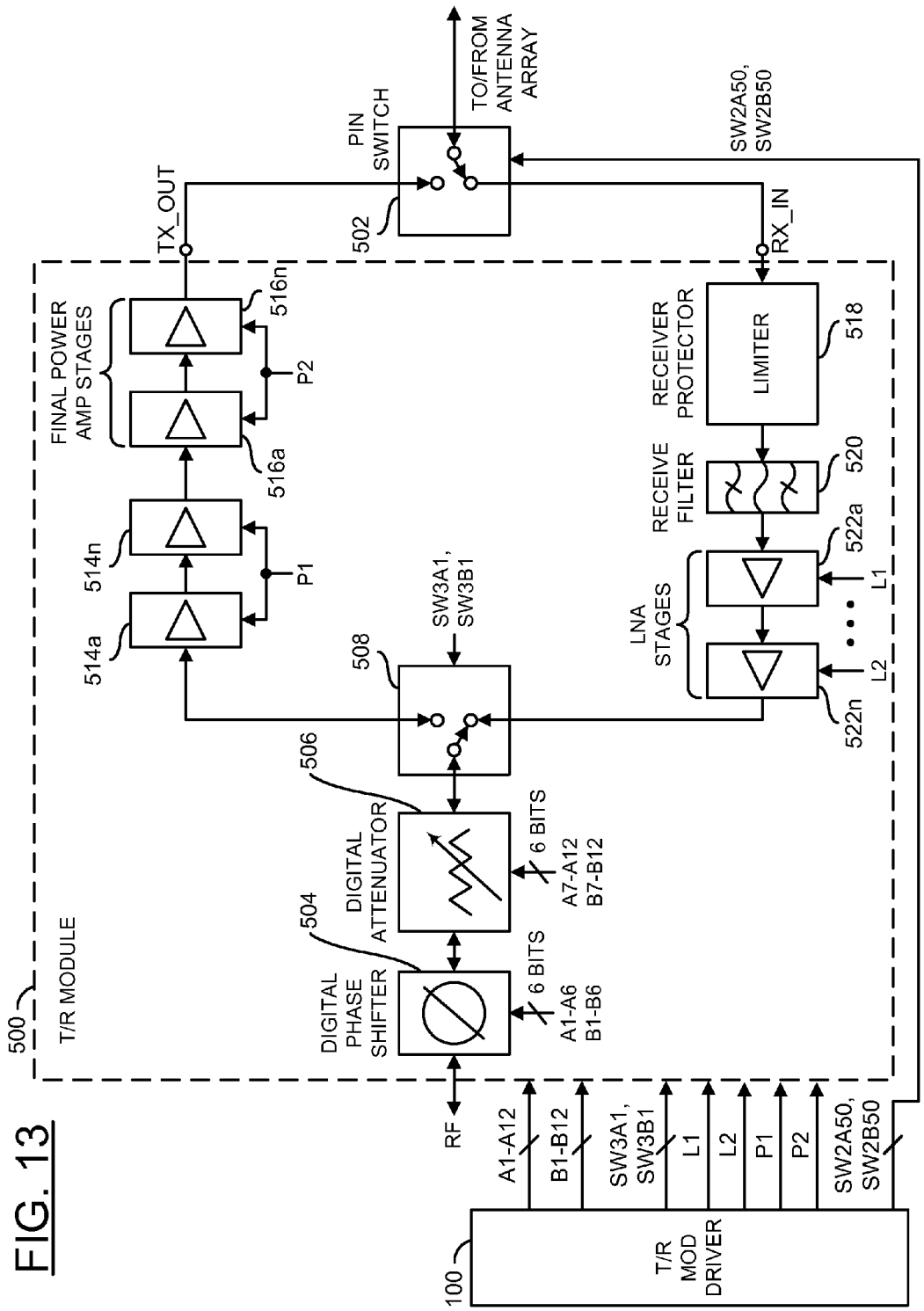
FIG. 13 is a diagram illustrating a T/R module driver in accordance with an embodiment of the present invention implemented in conjunction with a GaAs T/R module and an external PIN diode switch in a radar system.

Referring to FIG. 13, a diagram is shown illustrating a context in which a T/R module driver in accordance with an embodiment of the present invention is implemented with a monolithic T/R module and at least one PIN diode switch. In one example, the T/R module driver 100 may be connected with a T/R module 500 and a PIN diode switch 502. The PIN diode switch 502 is separate from (external to) the T/R module 500. In one example, the T/R module 500 and PIN diode switch 502 may be part of a radar system. However, other RF transmit/receive systems (e.g., cellular phone system, WiFi, etc.) may be implemented accordingly. The T/R module 500 may have an RF input/output connection (e.g., RF), a transmit output lead (e.g., TX_OUT), and a receive input lead (e.g., RX_IN). The output lead TX_OUT may be connected to a first terminal of the PIN diode switch 502, the input lead RX_IN may be connected to a second terminal of the PIN diode switch 502, and an antenna or antenna array may be connected to a third terminal of the PIN diode switch 502. A control input of the Pin diode switch may receive the signals SW2A50 and SW2B50 from the T/R module driver 100.

The T/R module 500 may comprise a module (or circuit) 504, a module (or circuit) 506, a module (or circuit) 508, a number of modules (or circuits) 514a-514n, a number of modules (or circuits) 516a-516n, a module (or circuit) 518, a module (or circuit) 520, and a number of modules (or circuits) 522a-522n. The module 504 may be implemented as a digital phase shifter. The module 506 may be implemented as a digital attenuator. The module 508 may be implemented as GaAs transmit/receive (T/R) switch. The modules 514a-514n may implement power amplifier (PA) stages of a transmit path of the T/R module 500. The modules 516a-516n may implement final power amplifier (PA) stages of the transmit path of the T/R module 500. The module 518 may implement a limiter configured to provide protection for a receiver path of the T/R module 500. The module 520 may implement a receive filter. The modules 522a-522n may implement low noise amplifier (LNA) stages of the receive path of the T/R module 500.

The T/R module 500 may be configured to receive the signals A1-A12, B1-B12, SW3A1, SW3B1, L1, L2, P1, and P2 from the T/R module driver 100. In one example, the signals SW3A1 and SW3B1 may be used to control the T/R switch module 508 to select between transmit and receive modes of the T/R module 500. The signals SW2A50 and SW2B50 may be used to control the PIN diode switch 502 to select between the transmit and receive modes. Even though a unidirectional arrow is depicted in the T/R switch modules 502 and 508, signals may flow in either direction, as is needed to transmit and receive.

The transmit path of the T/R module 500 generally begins at the RF input/output terminal RF. An RF signal is presented to an input of the module 504. The RF signal may be phase shifted by the module 504. In one example, the module 504 may implement a variable phase shifter. For example, the module 504 may be configured to implement a number of bits (e.g., 6) of phase shift (e.g., 5.6° steps). However, other numbers of bits may be implemented accordingly to meet the design criteria of a particular implementation. The amount of phase shift may be determined, in one example, using the signals A1-A6 and B1-36. After the RF signal is phase shifted, the RF signal may be attenuated by the module 506. In one example, the module 506 may implement a variable resistance. For example, the module 506 may be configured to implement a number of bits (e.g., 6) of attenuation. The amount of attenuation may be determined, in one example, using the signals A7-A12 and B7-312. However, other numbers of bits may be implemented accordingly to meet the design criteria of a particular implementation. The modules 504 and 506 may implement the same or a different number of bits. For example, fine grained phase shift and attenuation may be employed to make small adjustments to a shape of an RF signal transmitted by an antenna array connected to the T/R module 500.

After being shifted and attenuated, the RF signal may exit the module 506 and continue to the power amplifier (PA) stages 514a-514n and 516a-516n via the module 508. In one example, the transmit path of the T/R module 500 may have four gain stages. However, other numbers of gain stages may be implemented accordingly to ensure that the transmitted signal has the requisite signal strength. The power amplifier stage 516n outputs the amplified RF signal to the output lead TX-OUT that is connected to the first terminal of the PIN diode switch 502, where the amplified RF signal is routed to an antenna or antenna array connected to the third terminal of the PIN diode switch 502.

The receive path of the T/R module 500 generally begins where the second terminal of the PIN diode switch 502 connects to the input lead RX_IN of the T/R module 500. The receive path continues through the module 518 and the module 520 to the modules 522a-522n. The module 518 generally limits the received RF signal to protect the receiver circuitry. The module 520 generally provides filtering of the received RF signal. The modules 522a-522n generally provide a number of gain stages forming a low noise amplifier (LNA). A low noise amplifier (LNA) is generally used to amplify the RF signal received by the antenna array, to increase the signal strength while minimizing added noise, prior to feeding the RF signal into other circuit components. A LNA is a type of amplifier that is optimized to produce as little noise as possible while still meeting amplification requirements for the signal. An output of the module 522n flows across the T/R switch module 508 to the module 506. The modules 508, 506, and 504 generally perform the same function on the received signals as performed on the transmitted signals. The output of the module 504 then travels to the RF input/output connection RF of the T/R module 500.

The signals L1, L2, P1, and/or P2 may be used to reduce power dissipation of the T/R module 500 by disabling (e.g., shutting down) one or more of the power amplifier stages of the transmit path or the low noise amplifier stages of the receive path depending upon whether the T/R module is in the transmit or receive mode. For example, the signal P1 may be used to enable/disable the modules 514a-514n, the signal P2 may be used to enable/disable the modules 516a-516n, the signal L1 may be used to enable/disable a first portion of the modules 522a-522n, and the signal L2 may be used to enable/disable a second portion of the modules 522a-522n. The signals L1 and L2 may be configured to control the operation of the low noise amplifier (LNA) stages 522a-522n in the receive path to reduce power dissipation during operation of the T/R module 500 in the transmit mode. The signals P1 and P2 may be configured to control operation of the power amplifier (PA) stages 514a-514n and 516a-516n in the transmit path to reduce power dissipation during operation of the T/R module 500 in the receive mode. By splitting the power and low noise amplifiers into stages and controlling the stages by separate signals, feedback paths may be eliminated that could lead to instability. For example, there would be a risk of feedback through the L1 control circuit causing oscillations if too many stages are controlled by the came control line. When switching between transmit and receive or receive and transmit modes, a period in an idle state (e.g., both transmit and receive functions disabled) may be provided to prevent potentially catastrophic loop oscillations.

Embodiments of the present invention may be used to implement transmit/receive (T/R) module drivers that may be used to drive conventional T/R modules as well as transmit/receive functions built with discrete devices. For example, embodiments of the present invention may be used to implement transmit/receive (T/R) module drivers configured to control various switches, phase shifters, attenuators, amplifiers (or gain stages), etc. of various transmit/receive systems. For example, the signals A1-A12, B1-B12, and/or SW1A50, SW1B50, SW2A50, SW2B50, SW3A1, SW3B1, SW4A1, and SW4B1 may be used to program sub-modules (e.g., phase shifters, attenuators, switches, etc.) of the transmit/receive systems. The signals L1, L2, P1 and/or P2 may be used to control the power to various sub-modules (e.g., amplifiers, etc.) of the transmit/receive systems. The signals SW1A50, SW1B50, and SW2A50, SW2B50 may provide 50 mA signals that may be used to control PIN diode transmit/receive switches of the transmit/receive systems. The signals SW3A1, SW3B1, and SW4A1, SW4B1 may provide 1 mA signals that may conserve current while controlling GaAs transmit/receive switches of the transmit/receive systems. Additional signals may be implemented accordingly to meet the design criteria of a particular implementation.

As used herein, the term "simultaneously" is meant to describe events that share some common time period but the term is not meant to be limited to events that begin at the same point in time, end at the same point in time, or have the same duration. The various signals presented by embodiments of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

While the invention has been particularly shown and described with reference to the preferred embodiments thereof, it will be understood by those skilled in the art that various changes in form and details may be made without departing from the scope of the invention.

The invention claimed is:

1. An integrated circuit comprising:
   a first circuit configured to generate a first plurality of complementary outputs based upon a serial data stream, a first control signal, and a second control signal; and
   a second circuit configured to generate one or more pairs of complementary output signals and a plurality of open-drain outputs in response to a third control signal, a fourth control signal, a fifth control signal, and a sixth control signal, wherein a first complementary output of each pair of complementary output signals has a higher current capability than a second complementary output of each pair of complementary output signals.

2. The integrated circuit according to claim 1, wherein said integrated circuit comprises a driver module configured to control a transmit/receive module.

3. The integrated circuit according to claim 2, wherein said integrated circuit and said transmit/receive module are encapsulated in a multi-chip module.

4. The integrated circuit according to claim 1, wherein said second circuit comprises:
   an output buffer circuit configured to generate four pairs of complementary signals; and
   a number of open-drain NMOS field effect transistors configured to present the open-drain outputs.

5. The integrated circuit according to claim 4, wherein said second circuit further comprises a number of voltage translators configured to generate inputs to said output buffer circuit and said number of open-drain NMOS field effect transistors in response to a number of input signals.

6. The integrated circuit according to claim 5, wherein said second circuit further comprises a transmit/receive logic circuit configured to generate the input signals to said voltage translators in response to said third, said fourth, said fifth, and said sixth control signals.

7. The integrated circuit according to claim 6, wherein said transmit/receive logic circuit comprises a look up table defining relationships between said plurality of outputs and said third and said fourth control signals.

8. The integrated circuit according to claim 1, wherein said first circuit comprises:
an output buffer circuit configured to generate said plurality of complementary outputs based upon a number of parallel input signals;
a data latch and multiplexer circuit configured to latch a plurality of latched parallel input signals in response to said first control signal and select the number of parallel input signals from said latched parallel input signals in response to said second control signal; and
a voltage translator circuit configured to translate a voltage level of the number of latched parallel input signals selected by said data latch and multiplexer circuit between a supply voltage of said data latch and multiplexer circuit and a supply voltage of said output buffer circuit.

9. The integrated circuit according to claim 1, wherein said integrated circuit is configured to switch a transmit/receive (T/R) module between a transmit mode, a receive mode, and an idle mode.

10. The integrated circuit according to claim 9, wherein said integrated circuit is configured to draw essentially no current while disabling one or more amplifiers of said transmit/receive (T/R) module during said idle state.

11. The integrated circuit according to claim 9, wherein said integrated circuit is part of at least one of a radar system and a radio frequency (RF) transmit/receive system.

12. A method of driving a transmit/receive module comprising the steps of:
generating a plurality of first complementary outputs based upon a serial bit stream, a first control signal, and a second control signal; and
generating a plurality of second complementary output signals and a plurality of open-drain outputs in response to a third control signal, a fourth control signal, a fifth control signal, and a sixth control signal.

13. The method according to claim 12, further comprising:
controlling one or more of a digital phase shifter and a digital attenuator using said plurality of first complementary outputs.

14. The method according to claim 12, further comprising:
controlling one or more digital phase shifters and one or more digital attenuators with said plurality of first complementary outputs.

15. The method according to claim 12, further comprising:
controlling one or more low current transmit/receive (T/R) switches with a first of said second complementary signals and controlling one or more PIN diode switches with a second of said second complementary signals.

16. The method according to claim 12, further comprising:
controlling one or more power amplifiers in a transmit path and one or more low noise amplifiers in a receive path in response to said third control signal and said fourth control signal.

17. The method according to claim 12, further comprising:
separately controlling two or more power amplifier stages in a transmit path in response to said third control signal and said fourth control signal using two or more of said open-drain outputs; and
separately controlling two or more low noise amplifier stages in a receive path in response to said third control signal and said fourth control signal using another two or more of said open-drain outputs.

18. The method according to claim 17, further comprising:
controlling one or more transmit/receive switches in response to one or more of said third and said fourth control signals.

19. The method according to claim 12, further comprising simultaneously controlling (i) one or more transmit/receive switches, (ii) one or more power amplifiers in a transmit path and (iii) one or more low noise amplifiers in a receive path based upon a logical combination of said third, said fourth, said fifth, and said sixth control signals, such that said transmit/receive module passes through an idle state when switching either from a transmit mode to a receive mode or from said receive mode to said transmit mode.

20. The method according to claim 19, wherein controlling said one or more power amplifiers in said transmit path and said one or more low noise amplifiers in said receive path further comprises drawing essentially no current while disabling said one or more power amplifiers in said transmit path and said one or more low noise amplifiers in said receive path during said idle state.

* * * * *